US007076744B2

(12) United States Patent
Kan

(10) Patent No.: US 7,076,744 B2
(45) Date of Patent: Jul. 11, 2006

(54) CIRCUIT DESIGN METHOD, APPARATUS, AND PROGRAM

(75) Inventor: Makiko Kan, Tokyo (JP)

(73) Assignee: Sony Corporation, Tokyo (JP)

( * ) Notice: Subject to any disclaimer, the term of this patent is extended or adjusted under 35 U.S.C. 154(b) by 239 days.

(21) Appl. No.: 10/706,238

(22) Filed: Nov. 12, 2003

(65) Prior Publication Data

US 2004/0098675 A1 May 20, 2004

(30) Foreign Application Priority Data

Nov. 15, 2002 (JP) ............................ P2002-331677

(51) Int. Cl.
*G06F 17/50* (2006.01)
(52) U.S. Cl. .............................................. 716/1; 716/2
(58) Field of Classification Search ................... 716/1, 716/2–5; 712/19
See application file for complete search history.

(56) References Cited

U.S. PATENT DOCUMENTS 4,967,340 A * 10/1990 Dawes ........................ 712/19

* cited by examiner

*Primary Examiner*—Sun James Lin
(74) *Attorney, Agent, or Firm*—Sonnenschein Nath & Rosenthal LLP

(57) ABSTRACT

A circuit design method able to design a processing circuit to be small in scale when designing a processing circuit for performing a plurality of different processings on predetermined data, comprising a first step of identifying second processings performing the same processing on the same data among pluralities of second processings forming each of a plurality of first processings when designing a processing circuit for applying a plurality of different first processings on predetermined data and a second step of designing a processing circuit having a processing circuit shared by the plurality of first processings and for performing the second processings identified at the first step.

6 Claims, 14 Drawing Sheets

FIG. 10

| | | | | |
|---|---|---|---|---|
| $OUT_0$: | a | $D^{K+1}a$ | $D^{2K+2}$ | ••• |
| $OUT_1$: | $Da$ | $D^{K+2}a$ | $D^{2K+3}$ | ••• |
| $OUT_2$: | $D^2a$ | $D^{K+3}a$ | $D^{2K+4}$ | ••• |
| $OUT_3$: | $D^3a$ | $D^{K+4}a$ | $D^{2K+5}$ | ••• |
| ⋮ | ⋮ | ⋮ | ⋮ | |
| $OUT_k$: | $D^ka$ | $D^{K+K+1}a$ | $D^{3K+1}$ | ••• |

⟶ TIME

CIRCUIT DESIGN METHOD, APPARATUS, AND PROGRAM

BACKGROUND OF THE INVENTION

1. Field of the Invention

The present invention relates to a method, apparatus, and program for designing a processing circuit for performing processing such as a linear transform as used in for example error correction coding and decoding.

2. Description of the Related Art

For example, in error correction coding and decoding of the Hamming code etc., various types linear transform processings are performed in a linear space defined on a finite field.

In such linear transform processing, for example, a predetermined base on the linear space is used to express a dimension on the linear space by a vector and linear transform processing is applied to this vector to obtain a new vector.

In the above-mentioned error correction coding and decoding, for example, sometimes a plurality of bits of predetermined data are subjected to a plurality of processings for different linear transforms.

Conventionally, for example, a processing circuit is designed to perform this plurality of processings independently.

Summarizing the problem to be solved by the invention, however, as explained above, if designing a processing circuit to perform the above plurality of processings independently, the processing circuit becomes large in scale.

SUMMARY OF THE INVENTION

An object of the present invention is to provide a circuit design method, apparatus, and program able to design a processing circuit to be small in scale when designing a processing circuit to perform a plurality of different processings on predetermined data.

According to a first aspect of the invention, there is provided a circuit design method executed by computer for designing a processing circuit for applying a plurality of different first processings to predetermined data comprising a first step of identifying second processings performing the same processing on the same data in pluralities of second processings forming each of the plurality of first processings and a second step of designing a processing circuit comprising a first processing circuit shared by the plurality of first processings and performing the second processings identified in the first step and a second processing circuit for performing processings other than the second processings identified in the first step in the pluralities of second processings forming each of the plurality of first processings.

That is, in the circuit design method of the first aspect of the invention, first, in a first step, second processings performing the same processing on the same data are identified among pluralities of second processings forming each of a plurality of first processings.

Then, in a second step, the processing circuit comprising a first processing circuit shared by the plurality of first processings and performing the second processings identified in the first step and a second processing circuit for performing processings other than the second processings identified in the first step among the pluralities of second processings forming each of the plurality of first processings is designed.

According to a second aspect of the invention, there is provided a circuit design apparatus of a processing circuit for applying a plurality of different first processings to predetermined data comprising a first means for identifying second processings performing the same processing on the same data in pluralities of second processings forming each of the plurality of first processings and a second means for designing a processing circuit comprising a first processing circuit shared by the plurality of first processings and performing the second processings identified by the first means and a second processing circuit for performing processings other than the second processings identified by the first means in the pluralities of second processings forming each of the plurality of first processings.

In the circuit design apparatus of the second aspect of the invention, a first means identifies second processings performing the same processing on the same data among the pluralities of second processings forming each of the plurality of first processings.

A second means designs a processing circuit comprising a first processing circuit shared by the plurality of first processings and performing the second processings identified by the first means and a second processing circuit for performing processings other than the second processings identified by the first means among the pluralities of second processings forming each of the plurality of first processings.

According to a third aspect of the invention, there is provided a program executed in a circuit design apparatus of a processing circuit for applying a plurality of different first processings to predetermined data comprising a first routine of identifying second processings performing the same processing on the same data in pluralities of second processings forming each of the plurality of first processings and a second routine of designing a processing circuit comprising a first processing circuit shared by the plurality of first processings and performing the second processings identified in the first routine and a second processing circuit for performing processings other than the second processings identified in the first routine in the pluralities of second processings forming each of the plurality of first processings.

BRIEF DESCRIPTION OF THE DRAWINGS

The above object and features of the present invention will be more apparent from the following description of the preferred embodiments given with reference to the accompanying drawings, wherein:

FIG. 10 is a view for explaining a data output timing of the processing circuit shown in FIG. 9;

DESCRIPTION OF THE PREFERRED EMBODIMENTS

Before giving an explanation of embodiments of the present invention, a more detailed explanation will be given of the related art for reference purposes.

[Related Art of Invention]

Figure 1:
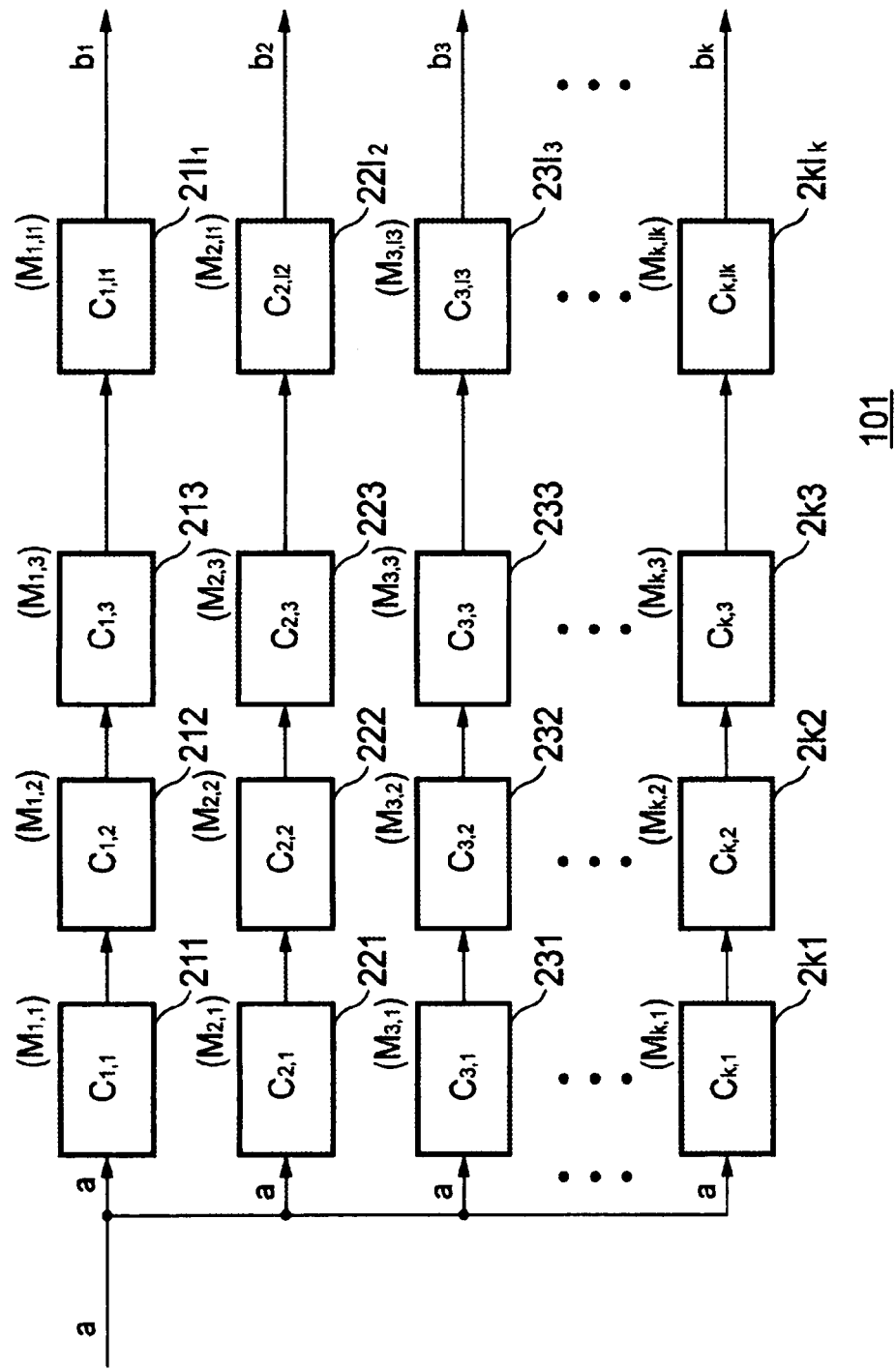
FIG. 1 is a view for explaining the related art of the present invention.

FIG. 1 is a view of the configuration of a processing circuit 101 according to a related art of the present invention.

The processing circuit 101 receives as input the data "a" and outputs the data $b_1$ to $b_k$.

The processing circuit 101 has a plurality of systems of processing circuit modules for sequentially performing processings $C_{i,l}$ to $C_{i,li}$ defined by matrixes $M_{i,l}$ to $M_{i,li}$ in the systems, where "i" is a natural number of 2 or more satisfying $1 \leq i \leq k$, and $l_i$ is a natural number. These processing circuit modules perform processings in parallel.

The processing modules are configured by directly connecting a plurality of processing circuits $2il_j$ for performing processings $C_{i,l}$ to $C_{i,lj}$.

The processing circuit 101 receives as input the data "a" expressed by a vector by a base on the linear space, applies linear processing to the data "a" in the processing circuits $21l_1$ to $2kl_k$, and outputs $b_1$ to $b_k$ from the processing circuits $21l_1$ to $2kl_k$.

Figure 2:
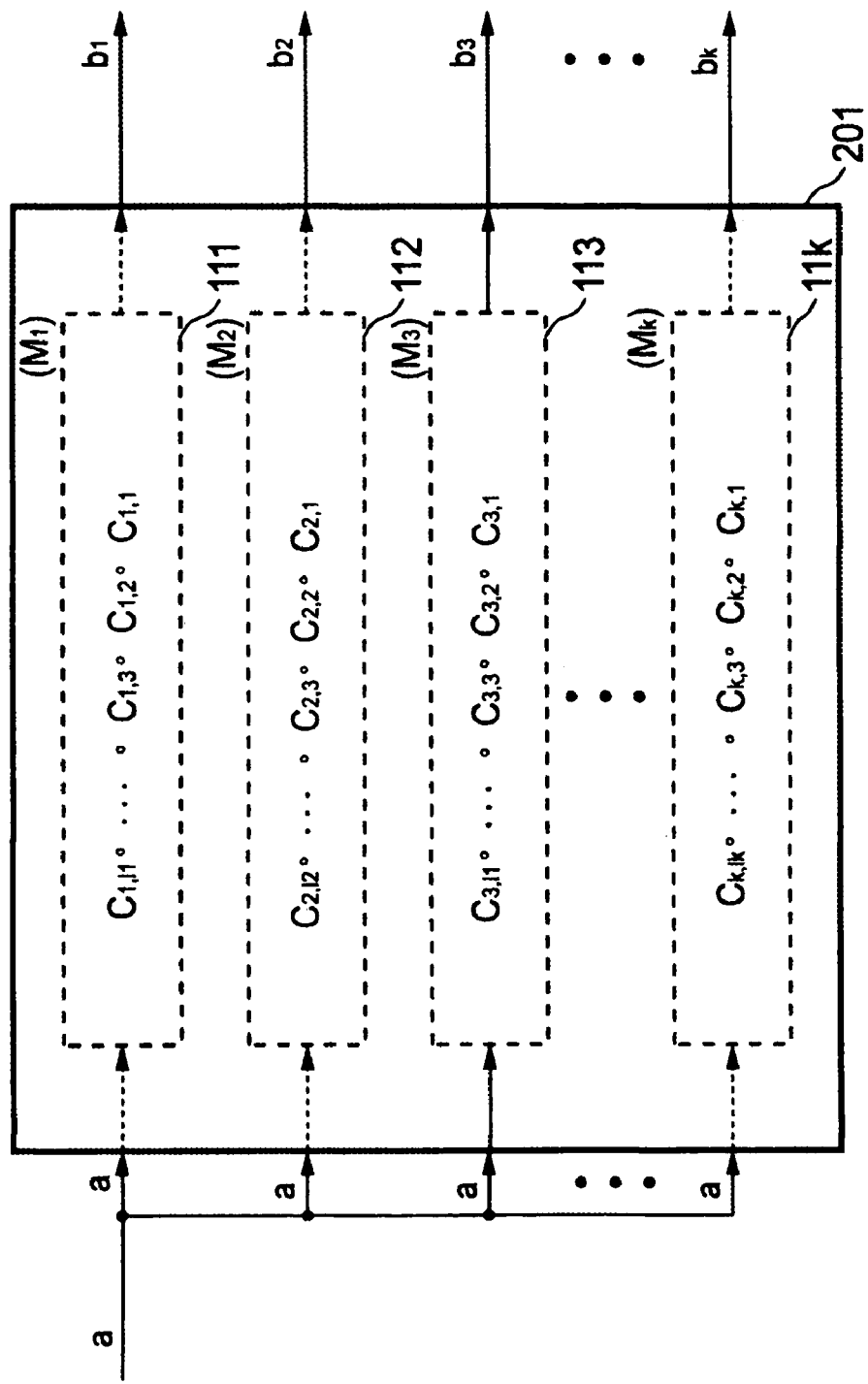
FIG. 2 is a view for explaining the related art of the present invention.

The processing circuit 101 shown in FIG. 1 can achieve a reduction of size and increase of speed by designing it like the processing circuit 201 using the processing circuit modules $il_j$ (j is integer of 2 or more) combining the processings $C_{i,l}$ to $C_{i,li}$ in the processing circuit modules as shown in FIG. 2.

In this case, linear transform strings defined as shown in FIG. 2 and the following (1-1) are combined as shown in the following (1-2):

$$\{C_{1,1}, C_{1,2}, \dots C_{1,l1}\}, \quad (1-1)$$
$$\{C_{2,1}, C_{2,2}, \dots C_{2,l2}\},$$
$$\dots \dots \dots \dots$$
$$\{C_{k,1}, C_{k,2}, \dots C_{k,lk}\},$$
$$\{\text{Range of } C_{i,j-1}\} \subset \{\text{Domain of } C_{i,j}\}$$

-continued
$$C_{1,l1} \circ \dots \circ C_{1,2} \circ C_{1,1} : a \mapsto b_1 \quad (1-2)$$
$$C_{2,l2} \circ \dots \circ C_{2,2} \circ C_{2,1} : a \mapsto b_2$$
$$\dots$$
$$C_{k,lk} \circ \dots \circ C_{k,2} \circ C_{k,1} : a \mapsto b_k$$

In this specification "X↦Y" means "Y" is obtains by performing a corresponding operation with respect to "X".

At this time, when making the processings $C_{i,l}$ to $C_{i,li}$ shown in the above (1-1) the matrix $M_{i,l}$ to $M_{i,li}$ for linear transforms, the above (1-1) and (1-2) are indicated as in the following (1-3) and (1-4):

$$\{M_{1,1}, M_{1,2}, \dots M_{1,l1}\}, \quad (1-3)$$
$$\{M_{2,1}, M_{2,2}, \dots M_{2,l2}\},$$
$$\dots \dots \dots \dots$$
$$\{M_{k,1}, M_{k,2}, \dots M_{1,lk}\}$$

$$M_1 := M_{1,l1} \dots M_{1,2} M_{1,1} : a \mapsto b_1 \quad (1-4)$$
$$M_1 := M_{2,l2} \dots M_{2,2} M_{2,1} : a \mapsto b_2$$
$$\dots$$
$$M_k := M_{k,lk} \dots M_{k,2} M_{k,1} : a \mapsto b_k$$

By this, the processing circuit 201 can be designed as a circuit for the matrix shown in the following (1-5):

$$M := \begin{pmatrix} M_1 \\ M_2 \\ \dots \\ M_k \end{pmatrix} : a \mapsto \begin{pmatrix} b_1 \\ b_2 \\ \dots \\ b_k \end{pmatrix} \quad (1-5)$$

Next, an explanation will be given of the design method for a processing circuit for performing a plurality of processings comprising applying first linear transforms D different predetermined numbers of times to the input data FS0 and outputting data $b_1$ to $b_k$ as the results of the related processings.

Figure 3:
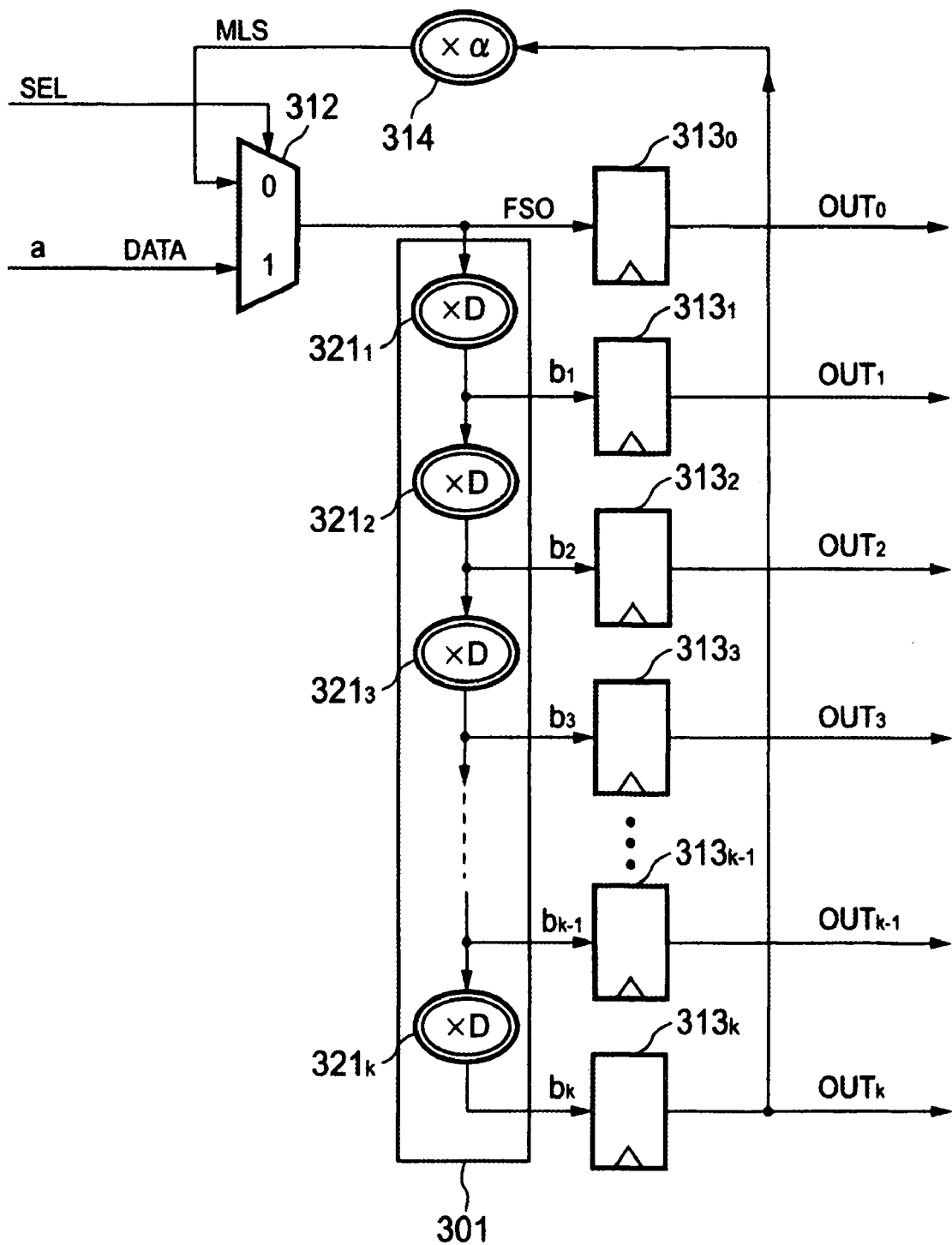
FIG. 3 is a diagram for explaining the related art of the present invention.

FIG. 3 is a view for explaining such a processing circuit 301 and the peripheral circuits thereof.

As shown in FIG. 3, a selector 312 selects one data between the input data "a" and the data MLS on the basis of a selection signal SEL and outputs the related selected data FS0 to a register $313_0$ and a processing circuit 301.

The processing circuit 301 performs a plurality of processings for applying first linear transforms D different predetermined numbers of times to the data FS0 input from the selector 312 and outputs the data $b_1$ to $b_k$ as the results of the processings to the registers $313_1$ to $313_k$.

The registers $313_1$ to $313_k$ hold the input data FS0 and $b_1$ to $b_k$ and output them as data $OUT_1$ to $OUT_k$ at predetermined timings.

The processing circuit 314 receives as input the data $OUT_k$, applies the first linear processing D to this, and outputs the data MSL as the result thereof to the selector 312.

The processing circuit 301 is designed, for example as shown in FIG. 3, by serially connecting a plurality of processing circuits $321_1$ to $321_k$ for performing linear transforms D, inputting the data "a" to the first stage circuit $321_1$, and outputting the data $b_1$ to $b_k$ generated at individual processing circuits $321_1$ to $321_k$ to the registers $313_1$ to $313_k$.

Figure 4:
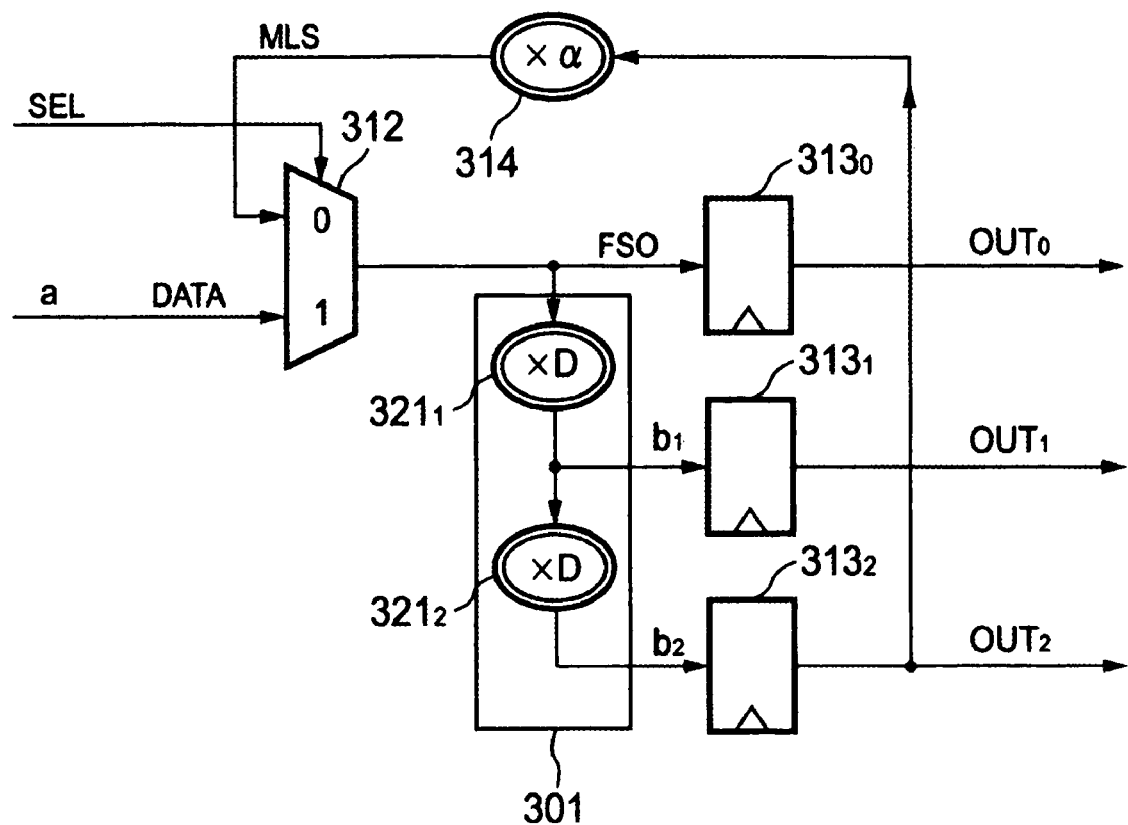
FIG. 4 is a view for explaining the related art of the present invention.

Here, the processing circuit 301 shown in FIG. 3 is designed as shown in FIG. 4 where it performs α-times multiprocessings on the dimension of the finite field $F(2^4)$, i.e., α, $\alpha^2+\alpha+1=0$.

Figure 5:
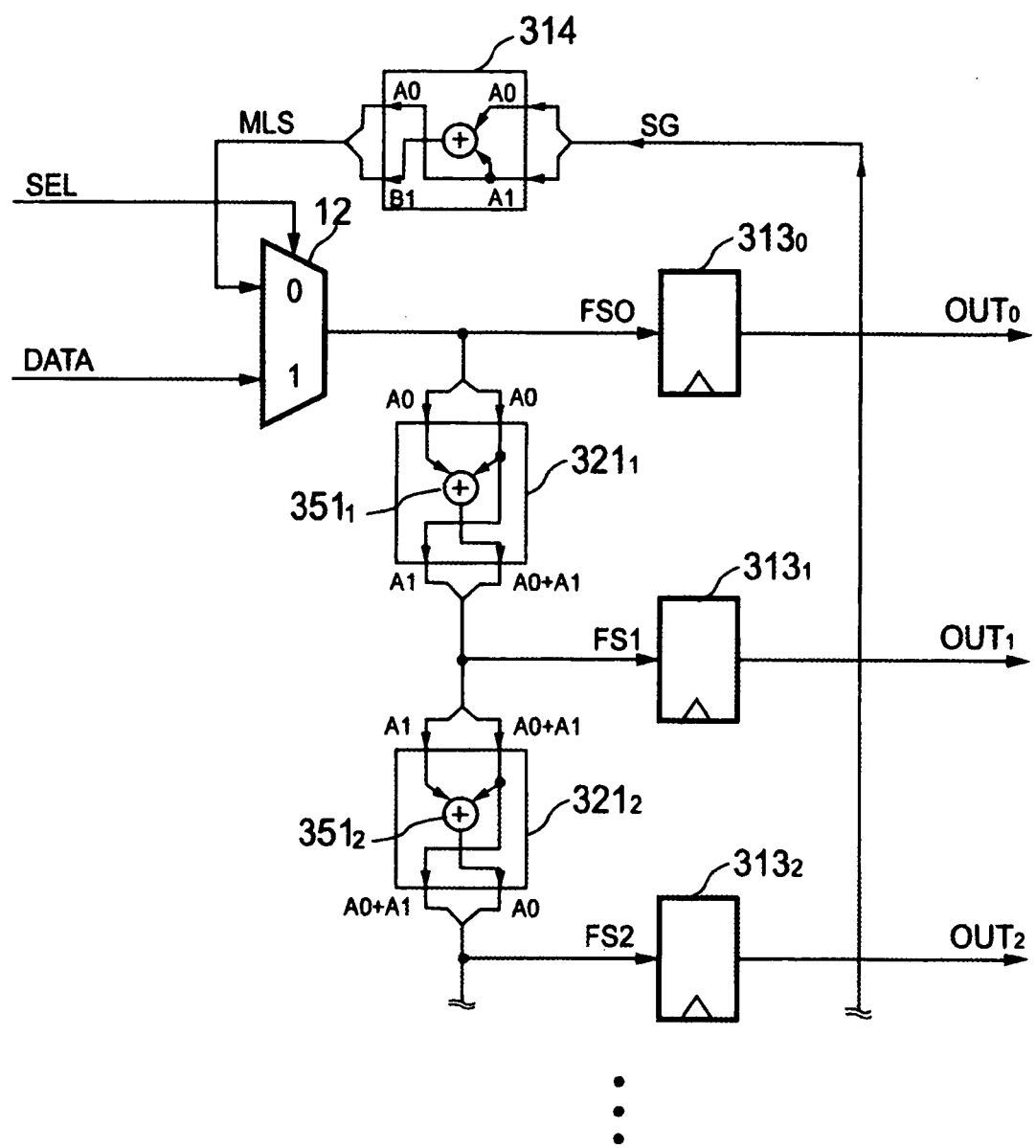
FIG. 5 is a view for explaining the related art of the present invention.

In this case, as shown in FIG. 3, for the data "a" input at a certain timing, the data $OUT_0$, $OUT_1$, and $OUT_2$ become as follows:

$OUT_0$: a, $a*\alpha^{k+1}$, $a*\alpha^{k+2}$, ..., $OUT_1$: $a*\alpha$, $a*\alpha^{K+2}$, $a*\alpha^{2K+3}$, ..., $OUT_2$: $a*\alpha^2$, $a*\alpha^{K+3}$, $a*\alpha^{2K+4}$, ..., Here, where $FS0 = A0 + A1\alpha$, these become as follows:

$FS0 \cdot \alpha = A1 + (A0+A1)\alpha$ $FS0 \cdot \alpha^2 = (A0+A1) + A0\alpha$ Accordingly, the processing circuits $321_1$ and $321_2$ shown in FIG. 4 are individually designed by the adder circuits $351_1$ and $351_2$ as shown in FIG. 5.

As mentioned above, however, there is a problem in that the circuit scale becomes large when designing the processing circuit 301.

Further, in the processing circuit 301, there is a problem in that the time from when the data "a" is input to the first stage circuit $321_1$ to when the data $b_k$ is output from the final stage circuit $321_k$ becomes long, so a high performance processing circuit 301 cannot be designed.

Below, an explanation will be given of an embodiment of the present invention for solving the problems of the related art mentioned above.

[First Embodiment]

Figure 6:
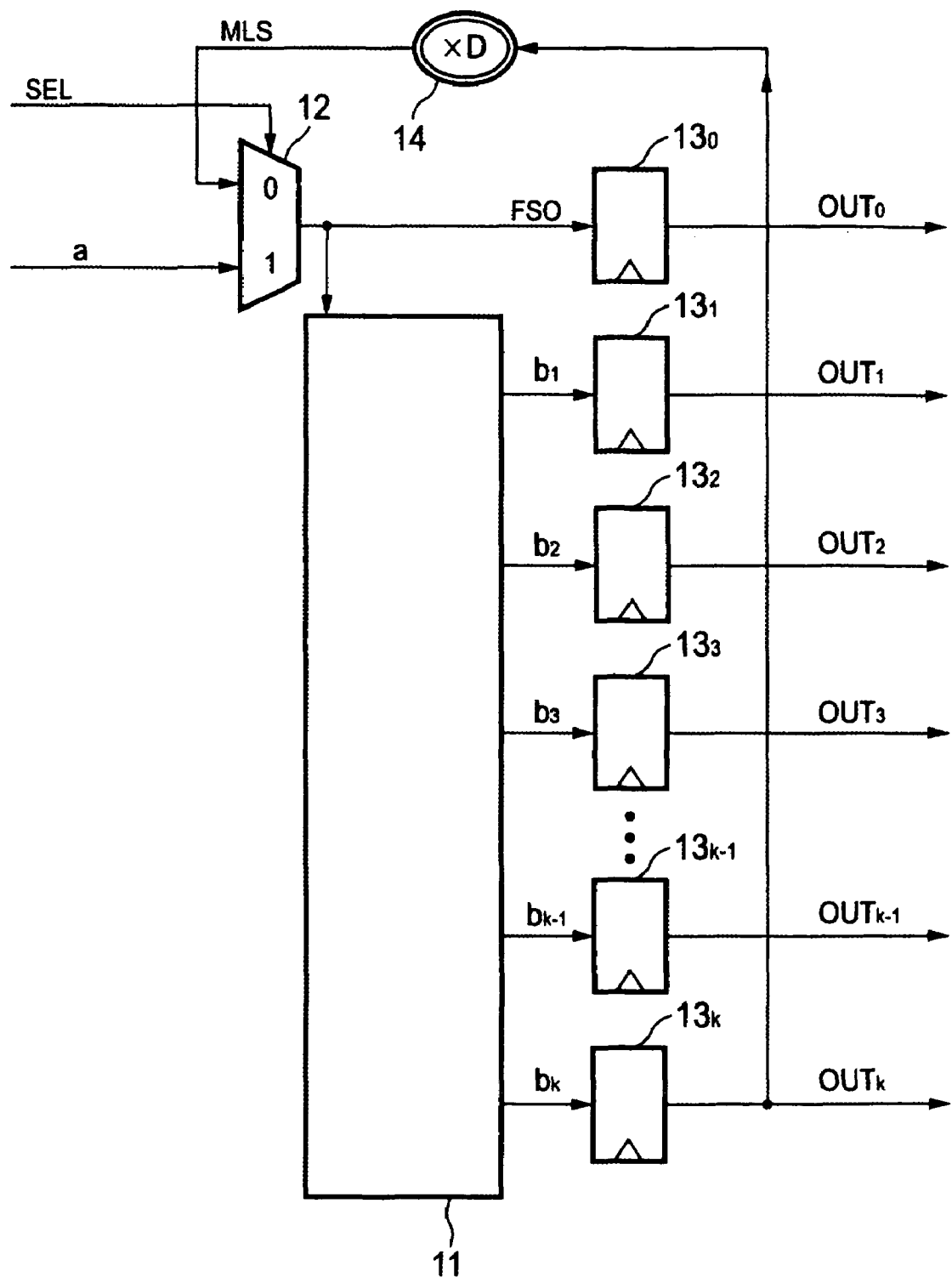
FIG. 6 is a view for explaining peripheral circuits of a processing circuit designed by a circuit design method of a first embodiment of the present invention.

FIG. 6 is a view for explaining peripheral circuits of a processing circuit 11 designed by the circuit design method of the present embodiment.

As shown in FIG. 6, a selector 12 selects one data between the input data "a" and the data MLS on the basis of a selection signal SEL and outputs the selected data FS0 to a register $13_0$ and the processing circuit 11.

The processing circuit 11 performs a plurality of processings for applying first linear transforms D different predetermined numbers of times to the data FS0 input from the selector 12 and outputs the data $b_1$ to $b_k$ as the results of the processings to the registers $13_1$ to $13_k$.

The registers $13_1$ to $13_k$ hold the input data FS0 and $b_1$ to $b_k$ and output them as data $OUT_1$ to $OUT_k$ at predetermined timings.

The processing circuit 14 receives as input the data $OUT_k$, applies the first linear processing D to this, and outputs the data MSL as the result thereof to the selector 12.

The circuit design method of the present embodiment designs the processing circuit 11 shown in FIG. 6.

In the present embodiment, when the predetermined linear space is an m-th enlargement of a finite field $F_q$, where "q" is the prime number and the dimension thereof is expressed by the m-th dimension vector on $F_q$, the predetermined linear space is indicated by the following (2-1) or $F(q^m)$ Linear space $Fg^m$ (2-1)

Further, using the base shown in the following (2-2) as the predetermined base, the data "a" of the predetermined data is indicated as in the following (2-3) on a basis of the base shown in the following (2-2):

$\{\gamma_1, \gamma_2, \ldots, \gamma_m\}$ (2-2)

$a = a_1\gamma_1 + a_2\gamma_2 + \ldots a_m\gamma_m$ (2-3)

Further, using the data "a" as the m-th dimension vector, the result becomes as in the following (2-4):

$$a = \begin{pmatrix} a_1 \\ a_2 \\ \vdots \\ a_m \end{pmatrix} \quad (2\text{-}4)$$

Further, the first linear transform D is defined as the linear transform D on the linear space shown in the above (2-1).

Further, the data "b" of the result of the above plurality of processings is shown as the k-th dimension vector by the following (2-5) and the data bi indicating the results of the processings forming the data "b" shown in the following (2-5) is shown as the di-th dimension vector by the following (2-6):

Here, "m" and di are integers of 2 or more, the predetermined number of times corresponding to at least one of the above plurality of processings is 2 or more, and "k" is an integer of 2 or more.

$$b = \begin{pmatrix} b_1 \\ b_2 \\ \vdots \\ b_k \end{pmatrix} \quad (2\text{-}5)$$

$$b_i = \begin{pmatrix} b_{i,1} \\ b_{i,2} \\ \vdots \\ b_{i,di} \end{pmatrix} \quad (2\text{-}6)$$

Here, when making the above plurality of processings $OP_1$ to $OP_K$, they are indicated by the following (3-7):

$$\begin{array}{lll} OP_1 : \{D\}, & D: & a \mapsto b_1 \\ OP_2 : \{D, D\}, & D^2 := D \circ D : & a \mapsto b_2 \\ OP_3 : \{D, D, D\}, & D^3 := D \circ D \circ D : & a \mapsto b_2 \\ \ldots \ldots & \ldots \ldots & \ldots \ldots \\ OP_k : \{D, D, D, \ldots, D\}, & D^k := D \circ D \circ D \circ \ldots \circ D : & a \mapsto b_k \end{array} \quad (2\text{-}7)$$

Then, when making the matrix comprised by "di" rows and "m" columns expressing the first linear transform D Md, the above (2-7) is indicated by the following (2-8):

$$\begin{array}{ll} \{M_d\}, & M_d : a \mapsto b_1 \\ \{M_d, M_d\}, & M_d^2 : a \mapsto b_2 \\ \{M_d, M_d, M_d\}, & M_d^3 : a \mapsto b_3 \\ \ldots \ldots \ldots & \\ \{M_d, M_d, M_d, \ldots, M_d\}, & M_d^k : a \mapsto b_k \end{array} \quad (2\text{-}8)$$

A matrix M of k·di×m obtained by vertically arranging the matrixes Md to $Md^k$ comprised of "di" rows and "m"

columns expressing the combination of the transform strings defined by the above $OP_1$ to $OP_K$ is shown by the following (2-9):

$$M := \begin{pmatrix} M_d \\ M_d^2 \\ \dots \\ M_d^k \end{pmatrix} : a \mapsto \begin{pmatrix} b_1 \\ b_2 \\ \dots \\ b_k \end{pmatrix} = \begin{pmatrix} D \cdot a \\ D^2 \cdot a \\ \dots \\ D^k \cdot a \end{pmatrix} \quad (2\text{-}9)$$

As shown in the above (2-9), the matrix M defines "k: number of processings for the first linear transform and the second transforms $D^2$ to $D^k$ on the data "a".

Figure 7:
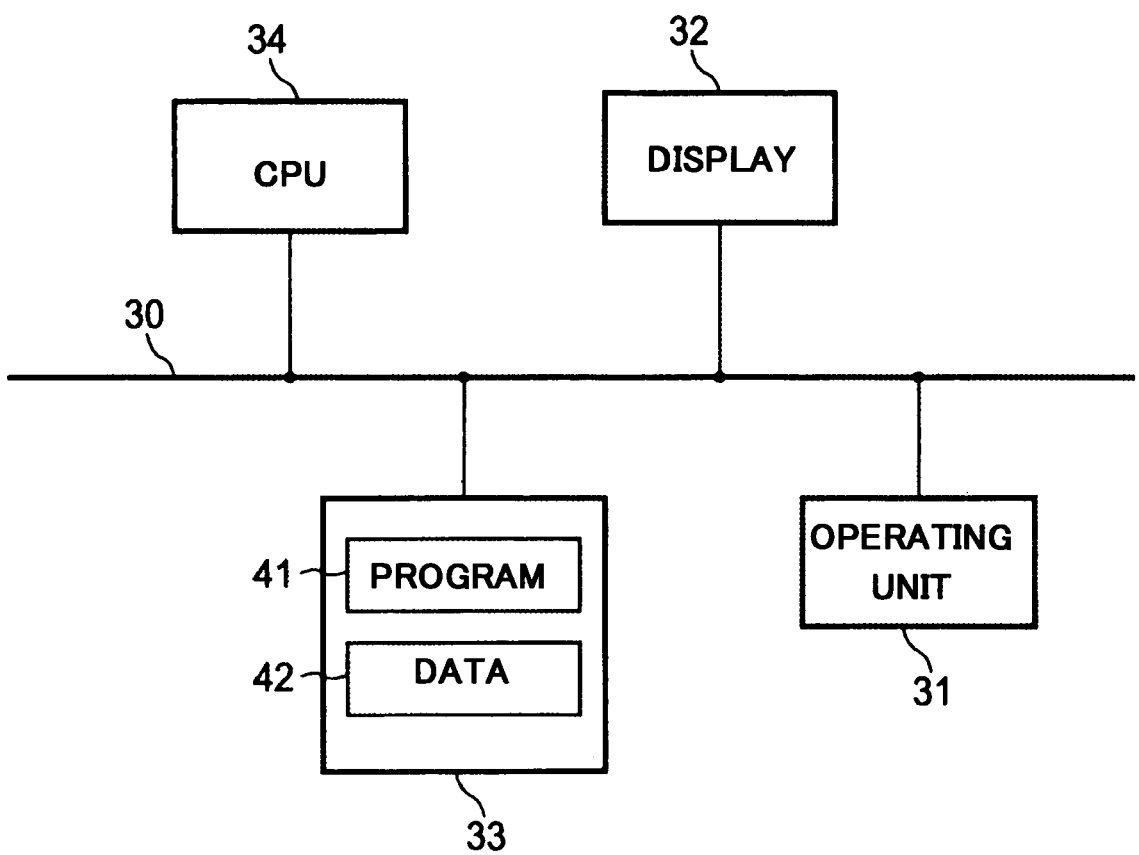
FIG. 7 is a view for explaining a computer for executing the circuit design method of the first embodiment of the present invention.

FIG. 7 is a view for explaining the computer 29 for executing the circuit design method of the present embodiment.

As shown in FIG. 7, the computer 29 has for example an operating unit 31, a display 32, a memory 33, and a CPU 34 all connected via a bus 30.

The operating unit 31 is an operating means such as a keyboard or a mouse and is used for instructing execution of the program, instructing selection of data, and inputting data at the CPU 34.

The display 32 displays the processing results of the CPU 34.

The memory 33 stores a program 41 to be executed by the CPU 34 and data 42 used for the execution of the program 41.

The CPU 34 executes the program 41 to perform the following processings and uses the data 42 in the process of execution of the program 41 for processing for designing the circuit of the processing circuit 11.

The program 41 corresponds to the program of the present invention and describes routines indicating the contents of the following steps.

Further, the circuit design apparatus of the present invention is configured by the CPU 34 executing the program 41. The CPU 34 executes step ST12 to design the first means of the present invention, and the CPU 34 executes step ST13 to design the second means of the present invention.

Below, an explanation will be given of an example of the operation of the circuit design method of the present embodiment in relation to the processing of the CPU 34.

Figure 8:
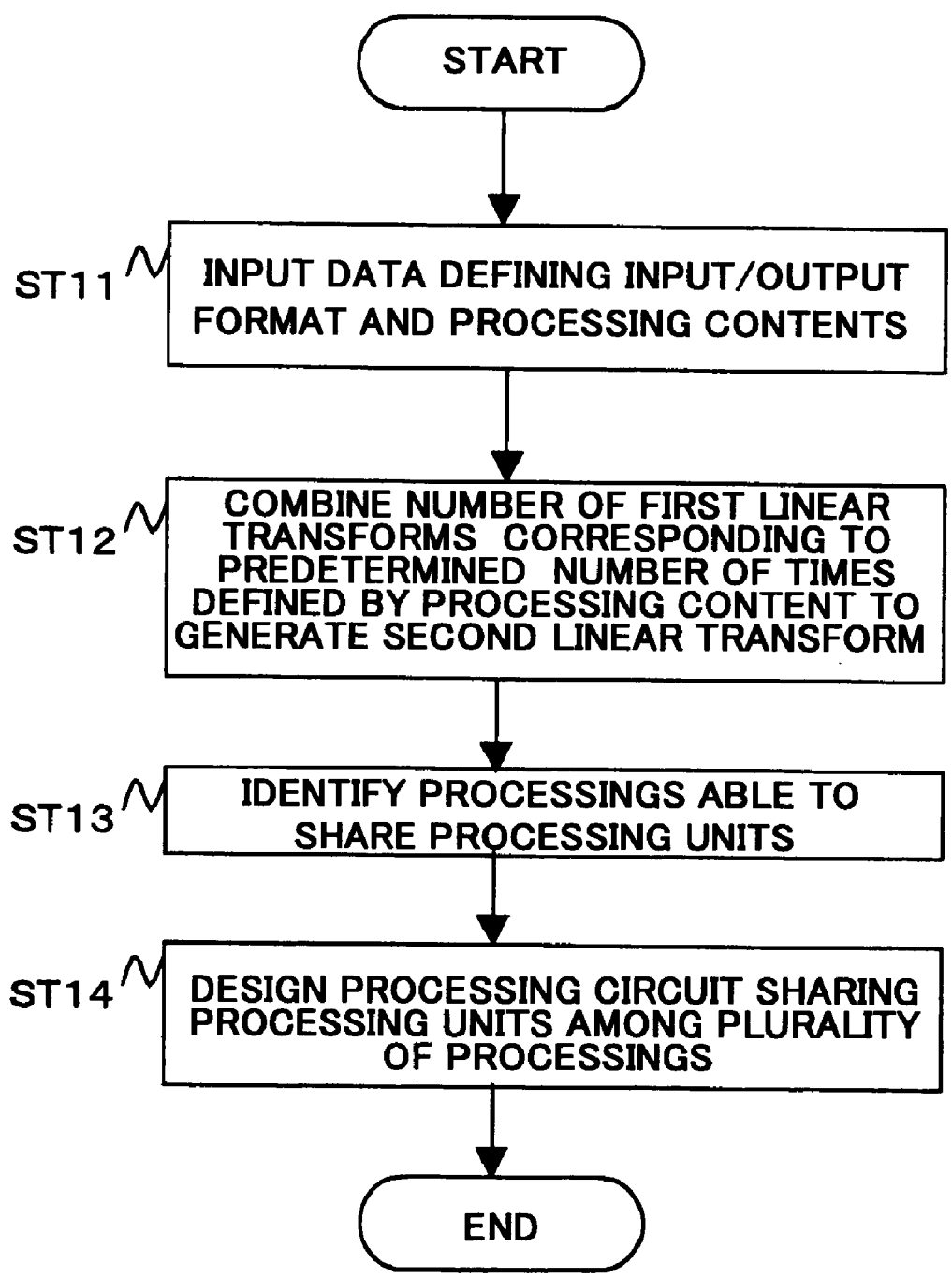
FIG. 8 is a flow chart for explaining a case of designing a processing circuit by the procedure of the circuit design method of the first embodiment of the present invention.

FIG. 8 is a flow chart for explaining an example of the operation of the circuit design method of the present embodiment.

Step ST11

The CPU 34 receives as input the data for defining the formats of the input and the output of the processing performed by the processing circuit 11 as shown in the above (2-4), (2-5), and (2-6) and the contents of a plurality of processings for applying a number of first linear transforms D corresponding to the predetermined number of times of processing by the processing circuit 11 to the data "a" as shown in the above (2-7) in accordance with an operation by the user on the operating unit 31.

Step ST12

The CPU 34 performs the processing for generating the matrix M indicated in the above (2-9) for performing the second linear transform (first processing) obtained by combining a number of the first linear transforms D corresponding to the above predetermined number of times for each of the plurality of processings performed by the processing circuit 11 shown in the above (2-7) input at step ST11.

Step ST13

The CPU 34 identifies the second processings performing the same processing on the same data among the pluralities of second processings forming each of the plurality of second linear transforms (first processings) defined at the above step ST12.

Step ST14

Figure 9:
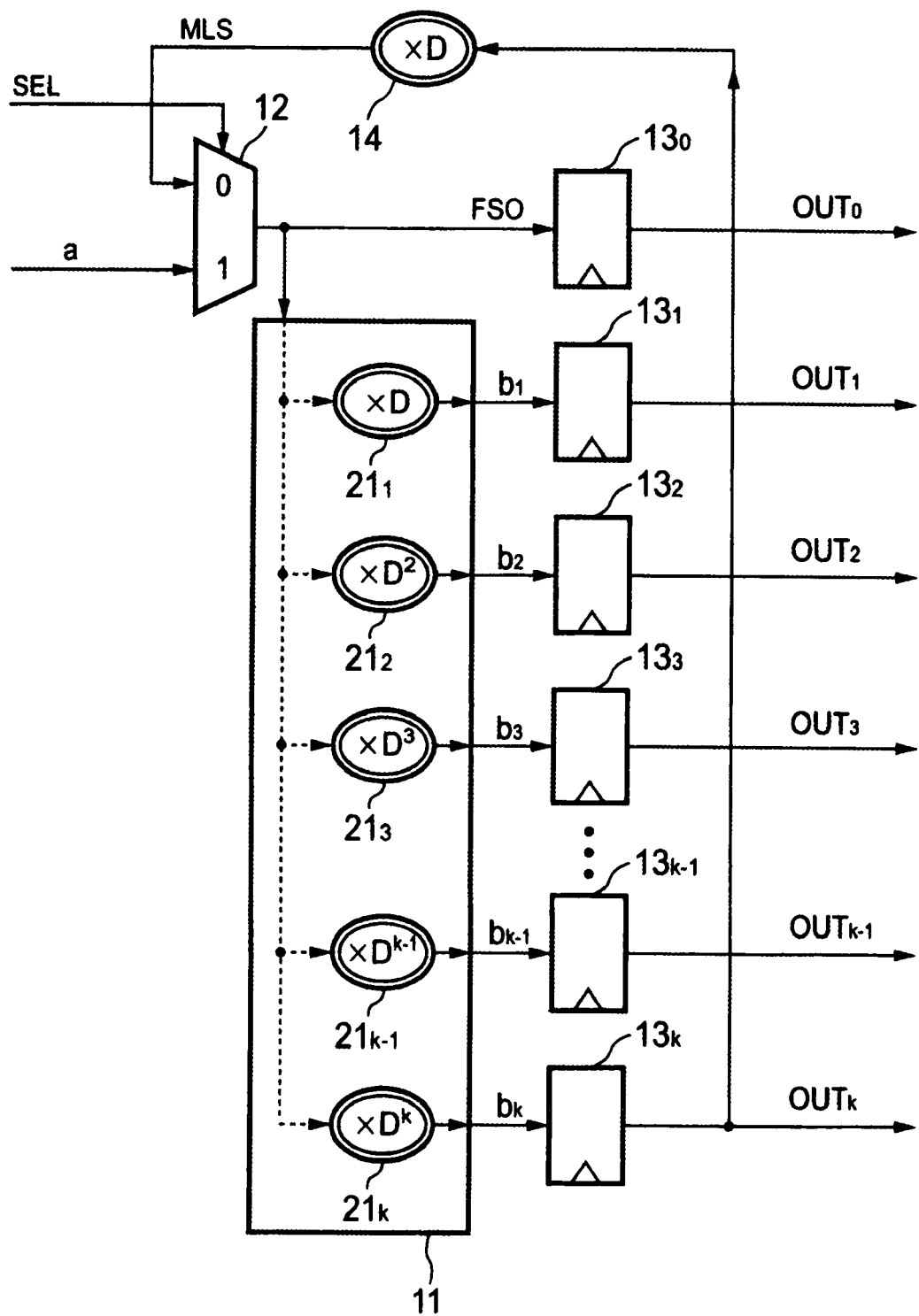
FIG. 9 is a view for explaining a processing circuit designed by the circuit design method of the first embodiment of the present invention.

The CPU 34 designs a processing circuit 11 shown in FIG. 9 comprised of a first processing circuit shared by the plurality of second linear transforms (first processings) and performing the second processings identified at step ST13 and a second processing circuit for performing the processings other than the above second processings identified at step ST13 among the above pluralities of second processings forming each of the above plurality of first processings.

At this time, the CPU 34 generates the design data of the processing circuit 11 so as to perform "k" number of processings for performing the first linear transforms D to $D_k$ on the data FS0 in parallel on the basis of the matrix M generated at step ST12 shown in the above (2-9).

Concretely, the CPU 34 generates the design data indicating the design of the processing circuit 11 comprised of the processing circuits $21_1$ to $21_k$ for performing the first linear transforms D to $D^k$ on the data FS0 arranged in parallel as shown in FIG. 9.

By this, the CPU 34 generates the design data of the processing circuit 11 designed so as to apply the linear transforms defined by the matrix M indicated by above (2-9) to the input data FS0 and to output the data $b_1$ to $b_k$.

By designing the processing circuit 11 as shown in FIG. 9, the outputs from the registers $13_0$ to $13_k$ become as shown in FIG. 10 plotting the time in the lateral direction.

Namely, the data $b_1$ to $b_k$ are output from the processing circuit 1 at approximately the same timing, so the data $OUT_0$ to $OUT_K$ are also output at approximately the same timing.

At this time, the relationships among the processing of the matrix M performed by the processing circuit 11, the data FS0 input to the processing circuit 11, and the data $OUT_0$ to $OUT_K$ are indicated by the following (2-10):

$$M \cdot FSO = \begin{pmatrix} D \cdot FSO \\ D^2 \cdot FSO \\ D^3 \cdot FSO \\ \vdots \\ D^k \cdot FSO \end{pmatrix} = \begin{pmatrix} OUT_0 \\ OUT_1 \\ OUT_2 \\ \vdots \\ OUT_k \end{pmatrix} \quad (2\text{-}10)$$

Here, the matrix M is comprised by the dimension of the linear space defined by the above (2-1), so the data $OUT_1$ to $OUT_K$ (data $b_l$ to $b_k$) are defined as the product of the dimension of the linear space and elements of the data FS0 and the sum of the same. For this reason, the combinations become finite at most. For example, when the value "k" is large with respect to the value "m", as shown in FIG. 8, by feeding back the data $b_k$ output from the processing circuit 11 via the processing circuit 14 and the selector 12 to the processing circuit 11, a processing circuit 11 able to cope with a variety of processings can be constructed with a small scale design.

Below, when the processing circuits $21_1$ and $21_K$ of the processing circuit 11 shown in FIG. 9 perform α-times multiprocessing with respect to the dimensions of the finite field $F(2^4)$, i.e., α, $α^2+α+1=0$, they are designed like the processing circuit 221 shown in FIG. 11.

In this case, as shown in FIG. 3, for the data "a" input at a certain timing, the data $OUT_0$, $OUT_1$, and $OUT_2$ become as follows:

$OUT_0$: a, $a*\alpha^{k+1}$, $a*\alpha^{2k+2}$, ..., $OUT_1$: $a*\alpha$, $a*\alpha^{k+2}$, $a*\alpha^{2k+3}$, ..., $OUT_2$: $a*\alpha^2$, $a*\alpha^{k+3}$, $a*\alpha^{2k+4}$, ..., Namely, when FS0=A0+A1α, the data $OUT_0$, $OUT_1$, and $OUT_2$ in the next clock cycle become as follows:

$OUT_0$: FS0=A0+A1α

$OUT_1$: FS0·α=$A_1$+($A_0$+A1)α

$OUT_2$: FS0·α·α=(A0+A1)+A0α

In this case, at step ST13 shown in FIG. 8 mentioned above, the CPU 34 identifies the second processings performing the same processing on the same data among the plurality of second processings forming the above α-times multiprocessings, that is, the processing "A0+A1".

Figure 11:
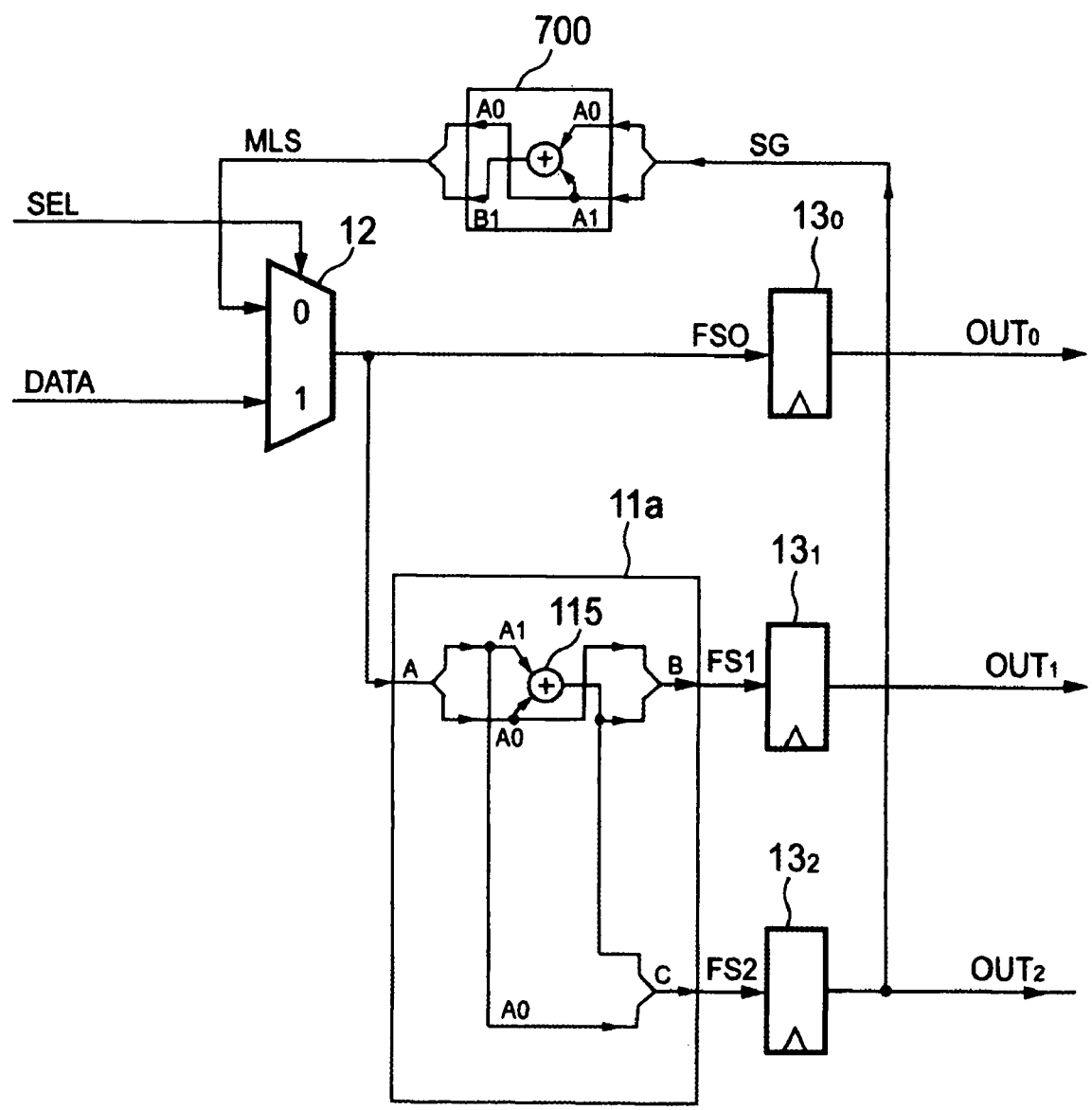
FIG. 11 is a view for explaining a concrete example of the processing circuit shown in FIG. 9.

Then, at step ST14 shown in FIG. 8, the CPU 34 designs a processing circuit 11a shown in FIG. 11 comprising a first processing circuit 115 shown in FIG. 11 (adder circuit in FIG. 11) shared by a plurality of α-times multiprocessings (that is, α-times multiprocessing and $\alpha^2$-times multiprocessing) and performing the processing "A0+A1" identified at step ST13 and a second processing circuit shown in FIG. 11 (none in the example shown in FIG. 11) for performing the processings other than the above second processings identified at step ST13 among the above pluralities of second processings forming each of the plurality of α-times multiprocessings.

Note that, in the above embodiment, when the above first linear transform is for performing the $\gamma^r$-times multiprocessings ($x\gamma^r$) with respect to the dimension γ of the linear space identified in the above (2-1), if the plurality of processings are $OP_1$ to $OP_K$, they are indicated by the following (2-11):

$OP_1 : \{(x\gamma^r)\},$  $(x\gamma^r):$  $a \mapsto b_1$ $OP_2 : \{(x\gamma^r), (x\gamma^r)\},$  $(x\gamma^r) \circ (x\gamma^r):$  $a \mapsto b_2$ $OP_3 : \{(x\gamma^r), (x\gamma^r), (x\gamma^r)\},$  $(x\gamma^r) \circ (x\gamma^r) \circ (x\gamma^r):$  $a \mapsto b_3$

... ...   ... ...   ... ...

$OP_k : \{(x\gamma^r), (x\gamma^r), (x\gamma^r), ..., (x\gamma^r)\}$  $(x\gamma^r) \circ (x\gamma^r) \circ (x\gamma^r) \circ ... \circ (x\gamma^r) \circ :$  $a \mapsto b_k$ Then, when making the matrix comprised by di rows and "m" columns expressing the first linear transform D Mr, the above (2-11) is indicated by the following (2-12):

$\{M_r\},$  $M_r : a \mapsto b_1$  (2-12)

$\{M_r, M_r\},$  $M_r^2 : a \mapsto b_2$ $\{M_r, M_r, M_r\},$  $M_r^3 : a \mapsto b_3$

... ... ... ...   ...

$\{M_r, M_r, M_r, ..., M_r\},$  $M_r^k : a \mapsto b_k$

The matrix Mr of k·dixm obtained by vertically arranging matrixes Mr to $Mr^k$ comprised by di rows and "m" columns expressing the combination of the transform strings defined by above $OP_1$ to $OP_K$ is indicated by the following (2-13):

Here, $Mr^x$ (x is an integer satisfying $1 \leq x \leq k$) is the matrix obtained by combining X number of Mrs.

$$M := \begin{pmatrix} M_r \\ M_r^2 \\ ... \\ M_r^k \end{pmatrix} : a \mapsto \begin{pmatrix} b_1 \\ b_2 \\ ... \\ b_k \end{pmatrix} = \begin{pmatrix} \gamma^r \cdot a \\ \gamma^{2r} \cdot a \\ ... \\ \gamma^{kr} \cdot a \end{pmatrix} \quad (2\text{-}13)$$

As shown in above (2-13), the matrix M defines "k" number of processings each performing $\gamma^r$ to $\gamma^{kr}$-times multiprocessings ($*\gamma^r$) on the data a.

Figure 12:
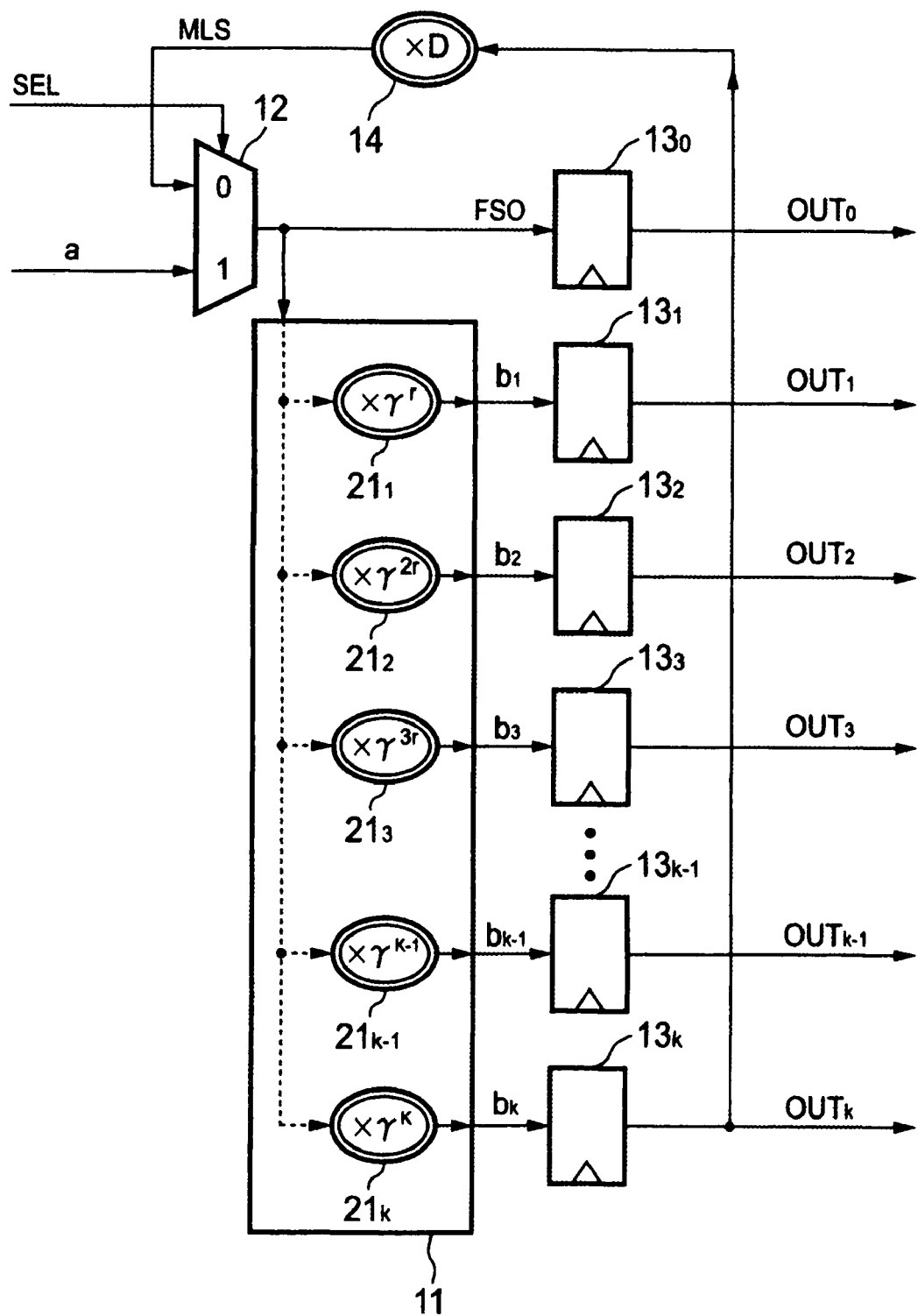
FIG. 12 is a view for explaining a processing circuit for performing $\gamma^r$ to $\gamma^{kr}$-times multiprocessings ($x\gamma^r$) defined by the circuit design method of the first embodiment of the present invention.

In this case, as shown in FIG. 12, the CPU 34 generates design data indicating the design of a processing circuit 11 having the processing circuits $21_1$ to $21_k$ each performing $\gamma^r$ to $\gamma^{kr}$-times multiprocessings ($*\gamma^r$) on the data FS0.

As explained above, in the circuit design method of the present embodiment, at step ST13 shown in FIG. 8, second processings performing the same processing on the same data among the pluralities of second processings forming each of the plurality of first processings (D-times multiprocessings and α-times multiprocessings) are identified.

Then, at step ST14, the processing circuits 11 and 11a comprising a first processing circuit shared by the plurality of first processings and performing the identified second processings and a second processing circuit for performing the processings other than the identified second processings among the pluralities of second processings forming each of the plurality of first processings are designed.

For this reason, according to the circuit design method of the present embodiment, the processing circuits 11 and 11a can be designed to be small in scale.

Further, in the circuit design method of the present embodiment, at step ST12 shown in FIG. 8, for each of the plurality of processings performed by the processing circuit 11 indicated in the above (2-7) input at step ST11, a matrix M indicated in the above (2-9) for performing the second linear transforms (first processings) obtained by combining the number of first linear transforms D corresponding to the predetermined number of times is generated. The processings of steps ST13 and ST14 mentioned above are carried out with respect to this.

For this reason, according to the circuit design method of the present embodiment, the processing circuits 11 and 11a can be designed to be small in scale and, at the same time, the processing time can be shortened.

Further, in the circuit design method of the present embodiment, as shown in FIG. 9 and FIG. 11, the processing circuit 11 performs the first processings in parallel on the data FS0, so the processing time can be further shortened.

Namely, the processing circuits $21_1$ to $21_k$ process the data FS0 (data "a") in parallel, so all of the data $b_1$ to $b_k$ (data $OUT_1$ to $OUT_K$) can be obtained at approximately the same timing.

For this reason, a processing circuit 11 shortening the time from when the data FS0 is input to when the data $b_2$ to $b_k$ are obtained over the design shown in FIG. 3 can be designed.

[Second Embodiment]

In the present embodiment, the case where 4 bits of data D (=D[3], D[2], D[1], D[0]) treated as dimensions on the finite field $F(2^4)$ are regarded as vertical vectors, and a circuit for applying two linear transforms indicated by the matrixes M1 and M2 shown in the following (2-14) and (2-15) with respect to the related data D is designed will be exemplified.

$$M1 = \begin{pmatrix} 1 & 1 & 0 & 1 \\ 1 & 0 & 1 & 0 \\ 0 & 0 & 0 & 1 \\ 0 & 1 & 1 & 0 \end{pmatrix} \quad (2\text{-}14)$$

$$M2 = \begin{pmatrix} 0 & 1 & 0 & 1 \\ 1 & 0 & 1 & 1 \\ 1 & 0 & 0 & 0 \\ 0 & 1 & 0 & 0 \end{pmatrix} \quad (2\text{-}15)$$

Conventionally, the output values E1=M1·D and E2=M2·D are expressed as vertical vectors and indicated by the following (2-16) and (2-17):

$$E1 = (E1[3], E1[2], E1[1], E1[0]) \quad (2\text{-}16)$$
$$= (D[1] + D[2], D[3], D[0] + D[2], D[0] + D[1] + D[3])$$

$$E2 = (E2[3], E2[2], E2[1], E2[0]) \quad (2\text{-}17)$$
$$= (D[1], D[0], D[0] + D[2] + D[3], D[1] + D[2])$$

Figure 13:
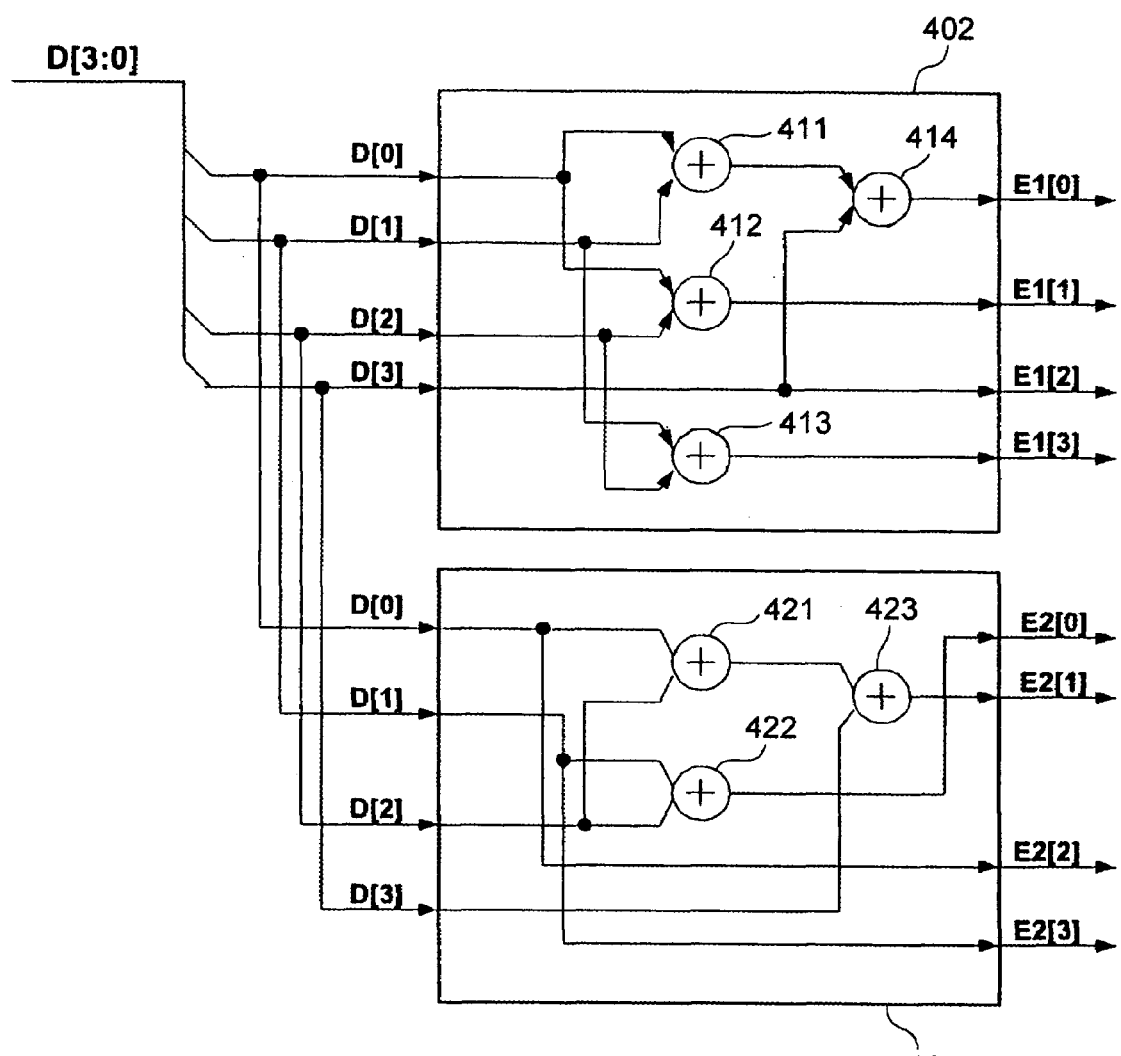
FIG. 13 is a view for explaining the related art of a circuit design method of a second embodiment of the present invention.

In the conventional circuit design method, as shown in FIG. 13, a processing circuit 401 comprising a processing circuit 402 for performing the processing shown in the above (2-16) and a processing circuit 403 for performing the processing shown in the above (2-17) is designed.

The processing circuit 402 is comprised of adder circuits 411, 412, 413, and 414.

Further, the processing circuit 403 is comprised of adder circuits 421, 422, and 423.

The circuit design method of the present embodiment is the same in that it applies the linear transforms expressed by the matrixes M1 and M2 shown in the above (2-14) and (2-15) to 4 bits of data D (=D[3], D[2], D[1], D[0]) handled as dimensions on the finite field $F(2^4)$.

In the present embodiment, in place of using two 4×4 matrixes, use is made of the matrix M shown in the following (2-18) connecting the matrixes M1 and M2:

$$M = \begin{pmatrix} M1 \\ M2 \end{pmatrix} = \begin{pmatrix} 1 & 1 & 0 & 1 \\ 1 & 0 & 1 & 0 \\ 0 & 0 & 0 & 1 \\ 0 & 1 & 1 & 0 \\ 0 & 1 & 1 & 0 \\ 1 & 0 & 1 & 1 \\ 1 & 0 & 0 & 0 \\ 0 & 1 & 0 & 0 \end{pmatrix} \quad (2\text{-}18)$$

In the circuit design method of the present embodiment, the processing of the above matrix M is carried out and, in the processings among the above (2-16) and (2-17), "D[0]+D[2]" and "D[1]+D[2]", which are common second processings, are identified among the plurality of second processings forming the first processing corresponding to the matrix M1 and the first processing corresponding to the matrix M2.

Figure 14:
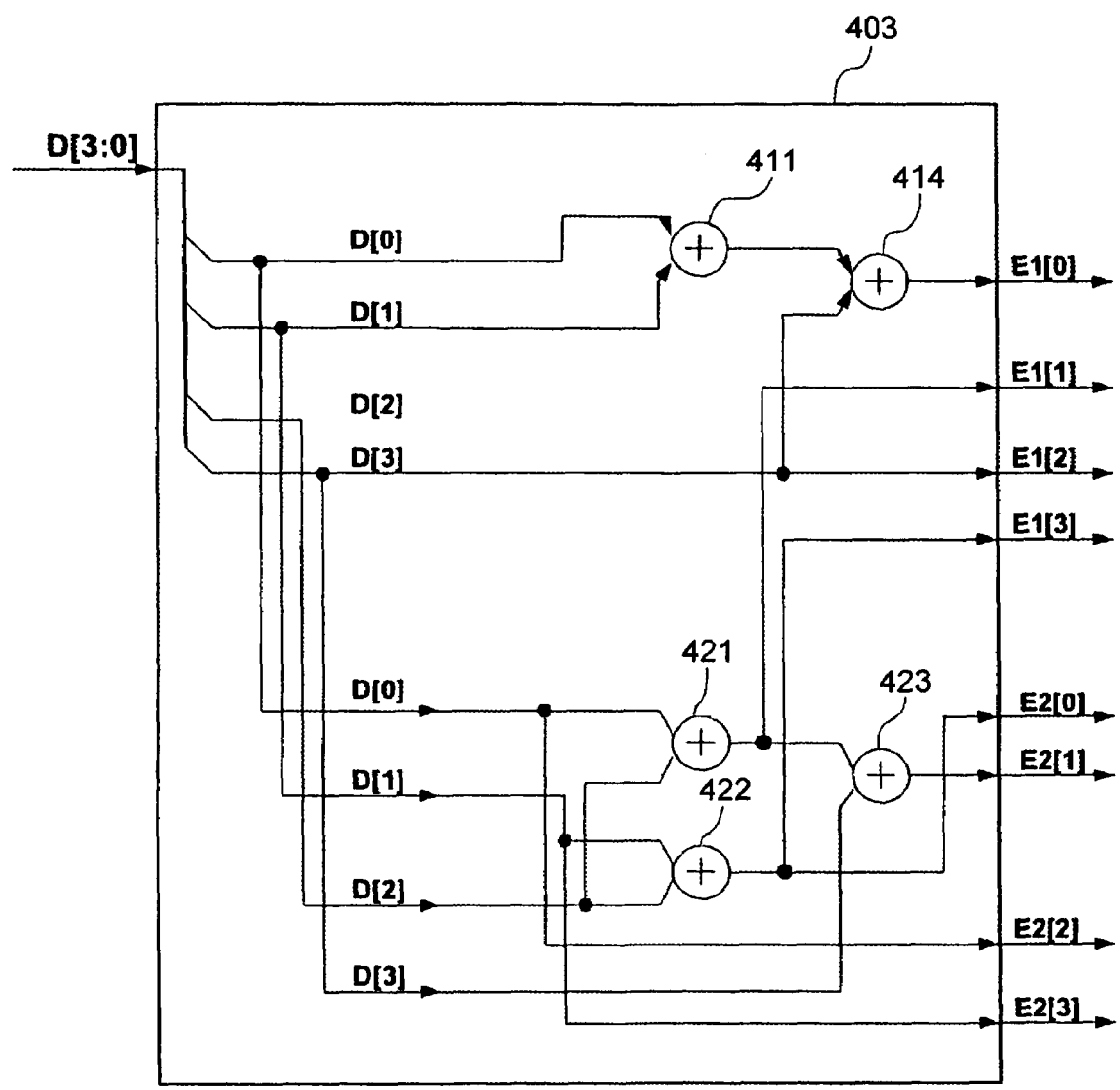
FIG. 14 is a view for explaining the circuit design method of the second embodiment of the present invention.

Then, as shown in FIG. 14, the adder circuits 412 and 421 shown in FIG. 13 for performing the second processing "D[0]+D[2]" and the adder circuits 413 and 422 shown in FIG. 13 for performing the second processing "D[1]+D[2]" are shared, so the adder circuits 412 and 413 are deleted. Therefore, a processing circuit 401 having a circuit scale reduced in comparison with the processing circuit 401 shown in FIG. 13 is designed.

By this, a processing circuit 403 shown in FIG. 14 for performing the same processing as the processing circuit 401 shown in FIG. 13 can be designed in a smaller scale in comparison with the processing circuit 401.

The present invention is not limited to the above embodiments.

As another embodiment, it is also possible to use a base shown in the following (2-19) as the above predetermined base, show the above data "a" as in the following (2-20), and show the data "a" as in the following (2-21) as the m-th dimension vector:

$$\{1, \gamma, \gamma^2, \ldots, \gamma^{m-1}\} \quad (2\text{-}19)$$

$$a = a_0 + a_1\gamma + a_2\gamma^2 + a_3\gamma^3 + \ldots + a_{m-1}\gamma^{m-1} \quad (2\text{-}20)$$

$$a = \begin{pmatrix} a_0 \\ a_1 \\ a_2 \\ \vdots \\ a_{m-1} \end{pmatrix} \quad (2\text{-}21)$$

Summarizing the effects of the invention, as explained above, according to the present invention, it is possible to provide a circuit design method, apparatus, and program able to design a processing circuit to be small in scale when designing a processing circuit for performing a plurality of different processings on predetermined data.

While the invention has been described with reference to specific embodiments chosen for purpose of illustration, it should be apparent that numerous modifications could be made thereto by those skilled in the art without departing from the basic concept and scope of the invention.

The invention claimed is:

1. A circuit design method executed by a computer for designing a processing circuit for applying a plurality of different first processings to predetermined data comprising:
   a first step of identifying second processings performing the same processing on the same data in pluralities of second processings forming each of said plurality of different first processings;
   a second step of designing a processing circuit comprising a first processing circuit shared by said plurality of different first processings and performing said second processings identified in said first step, and a second processing circuit for performing processings other than said second processings identified in said first step in said pluralities of second processings forming each of said plurality of different first processings; and
   when said plurality of different first processings are processings applying first linear transforms to said predetermined data different predetermined number of times, a third step of defining a second linear transform by combining a number of first linear transforms corresponding to a predetermined number of times of processing for each of the plurality of different first processings, wherein said first step further comprises identifying said second processings performing the same processing on the same data among said plurality of second processings forming said second linear transform defined for each of said plurality of different first processings at said third step.

2. The circuit design method as set forth in claim 1, further comprising, in said second step, designing said processing circuit so as to perform said plurality of different first processings in parallel on said predetermined data based on said second linear transforms defined in said third step.

3. The circuit design method as set forth in claim 1, wherein:

said predetermined data is expressed by a vector by a predetermined base on a predetermined linear space, and said predetermined linear transforms are transforms defined on said linear space.

4. The circuit design method as set forth in claim 3, further comprising, when said predetermined linear space is indicated by the following (3-1), data "a" of the predetermined data is indicated as an m-dimensional vector by the following (3-4) when using the base shown in the following (3-2) as the predetermined base and said data "a" is indicated as in the following (3-3), said first linear transform is defined as a linear transform D on the linear space shown in the following (3-1), data "b" of the result of the above plurality of processings is shown as a k-dimensional vector by the following (3-5), and data bi indicating the results of the processings forming the data "b" shown in the following (3-5) is shown as a di-dimensional vector by the following (3-6), defining matrix M comprised by di rows and "m" columns, performing said second linear transforms, and shown by the following (3-7) in said third step and identifying said second processings performing the same processing on the same data among said plurality of second processings based on the following (3-7) defined in said third step, where, "m" and di are integers of 2 or more, the predetermined number of times corresponding to at least one of the above plurality of processings is 2 or more, and "k" is an integer of 2 or more:

$$\text{Linear space } Fg^m \tag{3-1}$$

$$\{\gamma_1, \gamma_2, \ldots, \gamma_m\} \tag{3-2}$$

-continued $$a = a_1\gamma_1 + a_2\gamma_2 + \ldots a_m\gamma_m \tag{3-3}$$

$$a = \begin{pmatrix} a_1 \\ a_2 \\ \vdots \\ a_m \end{pmatrix} \tag{3-4}$$

$$b = \begin{pmatrix} b_1 \\ b_2 \\ \vdots \\ b_k \end{pmatrix} \tag{3-5}$$

$$b_i = \begin{pmatrix} b_{i,1} \\ b_{i,2} \\ \vdots \\ b_{i,di} \end{pmatrix} \tag{3-6}$$

$$M = \begin{pmatrix} D \\ D^2 \\ \vdots \\ D^K \end{pmatrix} \tag{3-7}$$

5. The circuit design method as set forth in claim 4, wherein when using the base shown by the following (3-8) as said predetermined base and said data "a" is shown as in the following (3-9), said data "a" is shown by the following (3-10) as an m-dimensional vector:

$$\{1, \gamma, \gamma^2, \ldots, \gamma^{m-1}\} \tag{3-8}$$

$$a = a_0 + a_1\gamma + a_2\gamma^2 + a_3\gamma^3 + \ldots + a_{m-1}\gamma^{m-1} \tag{3-9}$$

$$a = \begin{pmatrix} a_0 \\ a_1 \\ a_2 \\ \vdots \\ a_{m-1} \end{pmatrix} \tag{3-10}$$

6. The circuit design method as set forth in claim 4, wherein said third step defines said matrix M comprised of said matrixes D for performing $\gamma^r$-times multiprocessing based on the dimension $\gamma$ on said linear space.

* * * * *